(12) United States Patent
Boardman et al.

(10) Patent No.: US 10,367,162 B1
(45) Date of Patent: Jul. 30, 2019

(54) LIGHT-EMITTING DEVICE INCLUDING OPTICAL CAVITY WITH LOW ANGULAR COLOUR SHIFT

(71) Applicant: Sharp Kabushiki Kaisha, Osaka (JP)

(72) Inventors: Edward Andrew Boardman, Oxford (GB); James Andrew Robert Palles-Dimmock, Oxford (GB); Enrico Angioni, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/937,960

(22) Filed: Mar. 28, 2018

(51) Int. Cl.
| | | |
|---|---|---|
| H01L 29/06 | (2006.01) | |
| H01L 31/00 | (2006.01) | |
| H01L 51/50 | (2006.01) | |
| H01L 51/52 | (2006.01) | |
| H01L 27/32 | (2006.01) | |

(52) U.S. Cl.
CPC ........ H01L 51/5076 (2013.01); H01L 51/502 (2013.01); H01L 51/5056 (2013.01); H01L 51/5206 (2013.01); H01L 51/5221 (2013.01); H01L 51/5265 (2013.01); *H01L 27/32* (2013.01); *H01L 2251/5353* (2013.01); *H01L 2251/5369* (2013.01)

(58) Field of Classification Search
USPC ... 257/13, 81, 82, 91, 98, 99, 100, 116, 117, 257/432–437, 749, E33.056–E33.059, 257/E25.032; 438/25–28, 24, 46
See application file for complete search history.

(56) References Cited

U.S. PATENT DOCUMENTS

| | | | |
|---|---|---|---|
| 8,894,243 B2 | 11/2014 | Cho et al. | |
| 8,957,443 B2 | 2/2015 | Hwang et al. | |
| 9,219,250 B2 | 12/2015 | Jeong et al. | |
| 9,692,017 B2 | 6/2017 | Kim et al. | |
| 2011/0045392 A1* | 2/2011 | Lemmer | H01L 51/5048 430/56 |
| 2011/0095261 A1* | 4/2011 | Kazlas | B82Y 20/00 257/13 |
| 2015/0318481 A1* | 11/2015 | Gong | C08K 3/04 257/40 |
| 2017/0373277 A1 | 12/2017 | Noh et al. | |

FOREIGN PATENT DOCUMENTS

WO    WO 20170205174    11/2017

* cited by examiner

*Primary Examiner* — Niki H Nguyen
(74) *Attorney, Agent, or Firm* — Renner, Otto, Boisselle & Sklar, LLP

(57) ABSTRACT

A light-emitting device includes an emissive layer that emits light by recombination of first charges and second charges; a first electrode from which the first charges are supplied; a second electrode from which the second charges are supplied; a first charge transport layer that injects the first charges from the first electrode into the emissive layer; and a second charge transport layer that injects the second charges from the second electrode into the emissive layer. At least one of the charge transport layers is an absorbing charge transport layer that includes a light absorbing material that absorbs light within a portion of the emission spectrum of the light emitted by the emissive layer. The absorbing charge transport layer may be an ETL or an HTL, and may be located only between the first electrode and the emissive layer, only between the opposing second electrode and the emissive layer, or between both electrodes and the emissive layer.

20 Claims, 12 Drawing Sheets

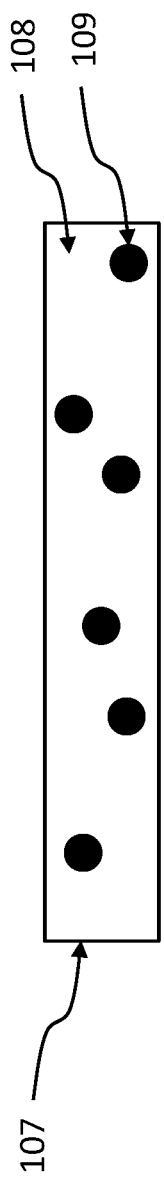
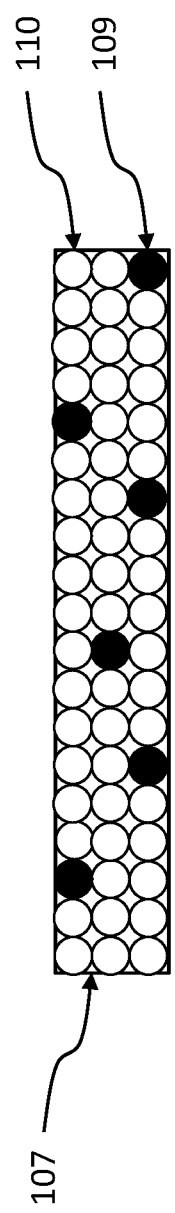

LIGHT-EMITTING DEVICE INCLUDING OPTICAL CAVITY WITH LOW ANGULAR COLOUR SHIFT

TECHNICAL FIELD

The present invention relates to light-emitting devices including an emissive layer disposed within an optical cavity, and more particularly to applications in which such light-emitting devices are configured to emit red, green or blue light for display applications.

BACKGROUND ART

A conventional light-emitting device includes a substrate, two electrodes (an anode and a cathode), an emissive layer (EML) containing a material that emits light upon electron and hole recombination, one or more layers between the anode and the EML, and one or more layers between the cathode and the EML. The one or more layers between the anode and the EML may be hole transporting layers (HTLs), hole injection layers (HILs), or electron blocking layers (EBLs). The one or more layers between the cathode and the EML may be electron transporting layers (ETLs), electron injection layers (EILs), or hole blocking layers (HBLs). For simplicity, any layer between an electrode and the EML may be referred to more generally as a charge transport layer (CTL). The CTLs in general operate to transport and inject electrons and holes into the emissive layer, where the electrons and holes recombine to produce light.

Such a light-emitting device in which the material that emits light is organic may be referred to as an organic LED (OLED). Such a light-emitting device in which the material that emits light is semiconductor quantum dots (QDs) may be referred to as a quantum dot LED (QD-LED, QLED or ELQLED).

In device configurations in which all the layers in the light-emitting device are planar, the refractive indices of the layers determine the proportion of the light generated in the EML that can be usefully outcoupled, i.e. emitted from the device into air ultimately to be received by a viewer or external device. Commonly used CTLs have a refractive index in the range 1.7-1.8, which limits the maximum outcoupling efficiency to approximately 20%. Increasing the outcoupling efficiency is desirable because it enables more efficient overall devices, decreasing power consumption and extending device lifetime.

One existing method to improve outcoupling efficiency is to create an optical cavity structure, also known as a microcavity, between the two electrodes or between an electrode and the device substrate. The microcavity may improve the light output coupling, modify the angular distribution of the emitted light, and/or modify the spectral properties of the emitted light such as the full width at half maximum (FWHM) of the emitted spectrum. However, the use of a microcavity structure to enhance light output coupling undesirably results in an increased change in the colour of the light with viewing angle because there is a shift in the emission spectrum to shorter wavelengths for larger viewing angles. A change in colour of the output light from the light-emitting device is an undesirable property when the device is used in display or lighting applications.

FIG. 1 is a drawing depicting a cross-sectional view of a conventional light-emitting device structure 100, such as an OLED or QD-LED. A stack of planar layers is disposed on a substrate 101, with the layers including: two electrodes including a cathode 102 and an anode 103, an emissive layer (EML) 104, one or more charge transport layers (CTL) 105 between the cathode and the EML, and one or more charge transport layers 106 between the anode and the EML. During operation, a bias is applied between the anode and the cathode. The cathode 102 injects electrons into the adjacent CTL 105, and likewise the anode 103 injects holes into the adjacent CTL 106. The electrons and holes propagate through the CTLs to the EML, where they radiatively recombine and light is emitted.

The emitted light may be outcoupled from the device into air, trapped within the layer stack, trapped within the substrate, or trapped within the electrodes as surface plasmons. Light which is trapped within the layer stack or within the substrate may eventually be absorbed. Only light that outcouples into air may be received by an external viewer or device, and therefore only this light contributes to the overall efficiency of the device 100. The device as described with reference to FIG. 1 may be referred to as a "standard" structure in that the anode is closest to the substrate relative to the cathode. However, the positions of the anode and cathode may be interchanged, and comparable principles are equally applicable to either structure. A device in which the cathode is closest to the substrate may be referred to as an "inverted" structure.

As light is generated in the EML and propagates through the layer stack, reflection will occur at interfaces between the different layers due to differences in optical properties, and particularly refractive index, as between the different layers. The EML and CTLs typically have similar refractive indices, and accordingly reflection at these interfaces is very weak. However, in configurations in which reflective or partially reflective electrodes are used, which typically is preferred, the optical properties of the CTLs differ significantly from optical properties of the adjacent electrode layers. Accordingly, a substantial amount of the light will be reflected at the CTL/electrode interfaces.

The two electrodes therefore define a microcavity structure around the EML, and the device structure behaves as a Fabry-Pérot etalon. The outcoupling from such a microcavity structure with transparent layers between the electrodes is a function of the wavelength of light and angle of emission, and may be approximated by:

$$I = \frac{T_2 \cdot (1 + R_1 + 2\sqrt{R_1} \cdot \cos\delta_1)}{1 + R_1 R_2 - 2\sqrt{R_1 R_2} \cdot \cos\delta}, \quad (1)$$

where subscripts refer to the first or second electrode, T is the transmission through the electrode, $T_1 = 0$, R is the reflectivity of the electrode, $$\delta_1 = \varphi_1 + \frac{4\pi z}{\lambda}\cos\beta, \quad \delta = \varphi_1 + \varphi_2 + \frac{4\pi L}{\lambda}\cos\beta,$$

φ is the phase shift on reflection from the electrode, β is the angle of emission in the EML (measured from the surface normal of the first electrode), z is the optical path length (the product of distance and refractive index) between the position the light is emitted from the EML and the first electrode at β=0°, L is the optical path length between the two electrodes at β=0°, and λ is the free space wavelength of the emission. The angle of emission from the device in air relative to the surface normal of the device, θ is related to β by $\sin(\theta) = n_{EML} \cdot \sin(\beta)$ where $n_{EML}$ is the refractive index of the EML at wavelength λ.

The intensity of emission from the microcavity at each θ and λ may be obtained by multiplying the cavity outcoupling function (equation 1) with the free space emission spectrum from the EML. The free space emission spectrum from the EML may be approximated by the photoluminescence (PL) spectrum from a thick EML, or by the electroluminescence (EL) spectrum from the EML in a structure without a strong microcavity, or by another method. The microcavity may be tuned by adjusting the optical distance between the two reflecting interfaces and by adjusting the position of the EML within the microcavity to obtain a cavity outcoupling function which has a local maximum which is at the same wavelength as the peak free space EML emission, thereby maximising the emission from the device.

The cavity outcoupling function, however, changes as a function of angle both because of the change in optical path length of the light through the layer stack, and because of the change in phase shift on reflection at the interface with the reflective electrode. This leads to the local maximum of the cavity outcoupling function moving to shorter wavelengths as the viewing angle increases away from normal incidence) (θ=0°. Because of the change in the cavity outcoupling function, the spectrum of the emitted light changes as a function of viewing angle and the apparent colour of the light changes. The colour of the light can be defined in the CIE 1976 colour space as is known in the art, representing the colour as a pair of coordinates (u',v'). The colour shift, Δu'v', may then be quantified by $\sqrt{[(u'_{\theta=0°}-u'_{\theta=\alpha})^2+(v'_{\theta=0°}-v'_{\theta=\alpha})^2]}$ where a is an angle substantially away from 0°. For example, α may be 45°, 60° or 80°.

There have been attempts to mitigate this undesirable colour shift. For example, U.S. Pat. No. 8,894,243 (Cho et al., issued Nov. 25, 2014) and U.S. Pat. No. 9,219,250 (Jeong et al., issued Dec. 22, 2015) disclose the use of a micro-patterned film applied to an OLED to reduce colour shift with viewing angle. U.S. Pat. No. 8,957,443 (Hwang et al., issued Feb. 17, 2015) discloses the use of a device in which one electrode is semi-transparent in one region and transparent in another region, thereby creating two different microcavities which together reduce the colour shift of the output light with viewing angle. U.S. Pat. No. 9,692,017 (Kim et al., issued Jun. 27, 2017) discloses a configuration of the microcavity in which the emission at normal incidence is optimised for a wavelength which is slightly shorter than the free space peak emission wavelength of the EML. This reduces colour shift with viewing angle, but the effectiveness is reduced as wavelength increases. WO 2017/205174 (Freier et al., published Nov. 30, 2017) discloses nanopatterning one or more interfaces between layers of an OLED to reduce colour shift with viewing angle. US 2017/0373277 (Noh et al., published Dec. 28, 2017) discloses the use of a "weak" microcavity which broadens the emission spectrum of the output light. This reduces the colour shift with viewing angle but reduces the colour purity of the output light, and this in turn reduces the achievable colour gamut of a display created using light-emitting devices as described.

These prior attempts to mitigate the colour shift, therefore, remain deficient by compromising other aspects of device performance to address the undesirable colour shift, and/or add substantial complexity to the device configuration and requirements of manufacturing.

SUMMARY OF INVENTION

The present disclosure describes a light-emitting device, such as an OLED or a QD-LED, which utilises a microcavity structure to enhance light output coupling while suppressing colour shift at high viewing angle. The colour shift is suppressed generally without requiring additional layers that are commonly added in conventional configurations to mitigate colour shift, including external colour filters, and without increasing manufacturing complexity.

In accordance with embodiments of the present invention, the structure of a light-emitting device is enhanced as compared to conventional configurations such that light absorption within the microcavity structure is no longer negligible at one or more wavelengths, λ, within the emission spectrum of the device at normal incidence. The absorbance may be quantified by the extinction coefficient κ, which is defined as the imaginary part of the complex refractive index. The absorption is introduced by using one or more absorbing CTLs in the device which have a non-zero extinction coefficient κ. A cavity absorption factor is a defined parameter associated with absorbance of different wavelengths of light within the emission spectrum, and the cavity absorption factor is dependent upon the extinction coefficient and thickness of the CTL layer or layers. The result of configuring a light-emitting device with a cavity absorption factor as defined is to attenuate the shorter wavelengths of light emitted from the device, and to act against the wavelength dependence of the cavity outcoupling function on viewing angle. This reduces the colour shift Δu'v' as a function of viewing angle for the device, and does so without substantially compromising other aspects of device performance and/or without adding significant complexity to the device configuration and manufacturing requirements.

In exemplary embodiments, a microcavity structure with the above-described properties of a cavity absorption factor may be created by using one or more absorbing charge transport layers, i.e. absorbing CTLs which have a non-zero extinction coefficient. An absorbing CTL may be a compositionally homogeneous layer, in which the charge transport material is also the light absorbing material with a non-zero extinction coefficient. Alternatively, the absorbing CTL may be a compositionally heterogeneous layer, in which an absorbing optical dopant, i.e., a material with a non-zero extinction coefficient κ, is added to a charge transport material. For example, absorbing nanoparticles may be included within an organic charge transport matrix, or absorbing nanoparticles may be mixed with conductive nanoparticles to form the CTL. The one or more absorbing CTLs may be disposed only between a first electrode closest to the substrate and the EML, only between the opposing second electrode and the EML, or between both electrodes and the EML.

Accordingly, an aspect of the invention is a light-emitting device that includes an absorbing charge transport layer to mitigate against the undesirable colour shift. In exemplary embodiments, the light-emitting device includes an emissive layer that emits light by recombination of first charges and second charges; a first electrode from which the first charges are supplied; a second electrode located on an opposite side of the emissive layer relative to the first electrode from which the second charges are supplied; a first charge transport layer located between the emissive layer and the first electrode that injects the first charges from the first electrode into the emissive layer; and a second charge transport layer located between the emissive layer and the second electrode that injects the second charges from the second electrode into the emissive layer. At least one of the charge transport layers is an absorbing charge transport layer that includes a light absorbing material that absorbs light within a portion of the emission spectrum of the light emitted by the emissive layer.

The absorbing charge transport layer may be an ETL or an HTL, and may be located only between the first electrode adjacent to the substrate and the emissive layer, only between the opposing second electrode and the emissive layer, or between both electrodes and the emissive layer. The absorbing charge transport layer may be a homogeneous layer of the light absorbing material, a heterogeneous layer comprising one or more light absorbing materials doped within a conductive material, or a heterogeneous layer comprising a mixture of light absorbing nanoparticles and conductive nanoparticles. When the absorbing charge transport layer is a homogeneous layer, the layer may comprise nanoparticles of the light absorbing material. When the absorbing charge transport layer is a heterogeneous layer, the one or more light absorbing materials may include absorbing atoms, ions, molecules and/or nanoparticles. The absorbing atoms, ions or molecules may be or include rare earth elements. The absorbing nanoparticles may comprise one or more inorganic metal oxides, rare earth oxides, or quantum dots. The conductive material may be an organic matrix or comprise conductive nanoparticles. The conductive material may be non-absorbing which, for the purposes of this disclosure, refers to materials that do not exhibit significant absorption of the light emitted from the EML, and may be characterized by an extinction coefficient less than approximately $1 \times 10^{-3}$, and preferably less than approximately $5 \times 10^{-4}$.

Another aspect of the invention is a display device having a plurality of light-emitting devices according to any of the embodiments. In such a display device, each light-emitting device has a peak emission wavelength at normal incidence in one of the red, green, or blue portion of the visible spectrum. As to each light-emitting device, the emissive layer, the first charge transport layer, the second charge transport layer, the anode, and the cathode comprise a microcavity structure. Each light emitting device is configured to have a cavity absorption factor of the microcavity structure directed to attenuating light of a wavelength having a shorter wavelength than a respective peak emission wavelength for said light-emitting device.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 2 is a drawing depicting an exemplary CTL layer in accordance with embodiments of the present invention.

FIG. 3 is a drawing depicting another exemplary CTL layer in accordance with embodiments of the present invention.

DESCRIPTION OF EMBODIMENTS

Figure 1:
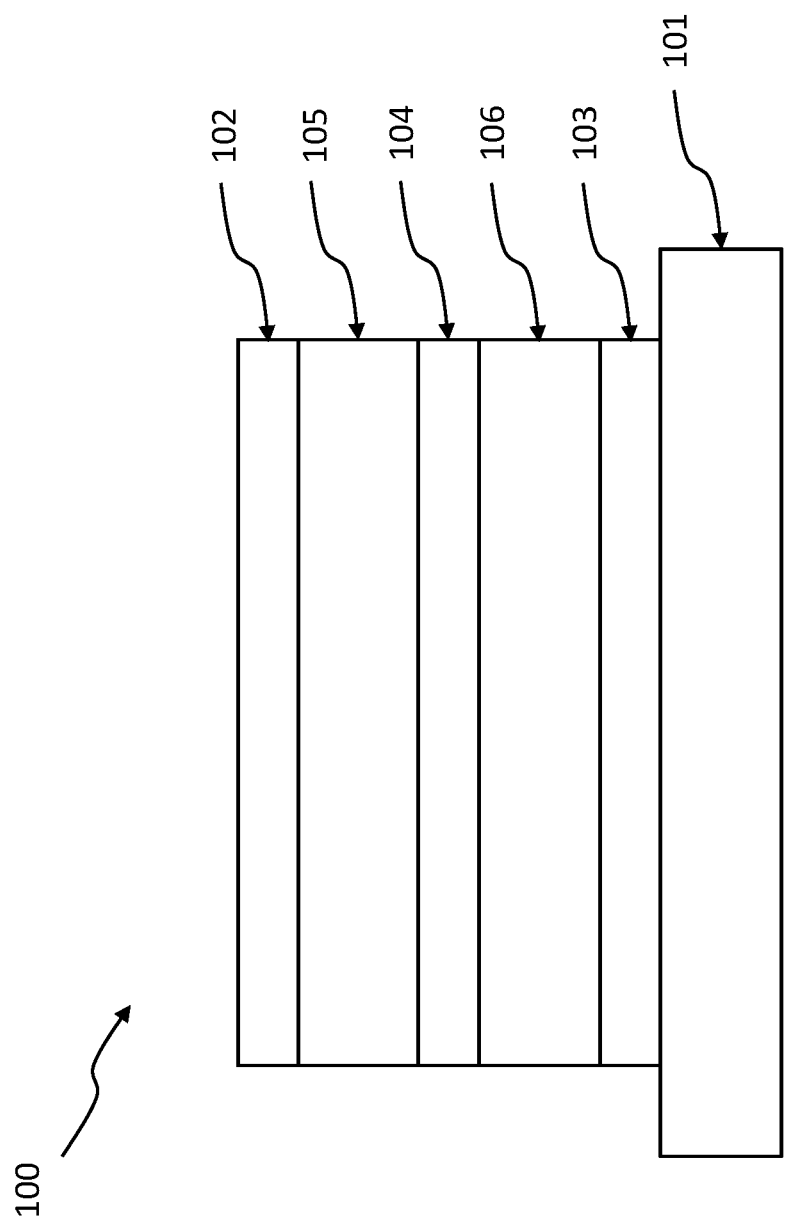
FIG. 1 is a drawing depicting an exemplary representation of a conventional light-emitting device.

Embodiments of the present invention will now be described with reference to the drawings, wherein like reference numerals are used to refer to like elements throughout. It will be understood that the figures are not necessarily to scale.

The present disclosure describes a light-emitting device, such as an OLED or a QD-LED, which utilises a microcavity structure to enhance light output coupling while suppressing colour shift at high viewing angle. The colour shift is suppressed generally without requiring additional layers that commonly are added to suppress colour shift in conventional configurations, including external colour filters, and without increasing manufacturing complexity.

In accordance with embodiments of the present invention, the structure of a light-emitting device is enhanced as compared to conventional configurations such that light absorption within the microcavity structure is no longer negligible at one or more wavelengths, $\lambda$, within the emission spectrum of the device at normal incidence. 'Wavelengths within the emission spectrum of the device at normal incidence' is preferably defined as wavelengths for which the emitted optical power is more than 0.5% of the optical power of the wavelength with the highest emitted optical power. As referenced above, the absorbance of a CTL within the microcavity structure may be quantified by an extinction coefficient $\kappa$, which is defined as the imaginary part of the complex refractive index. The absorption is introduced by using one or more CTLs in the device which have a non-zero extinction coefficient $\kappa$. A cavity absorption factor for a microcavity structure is a defined parameter associated with absorbance of different wavelengths of light within the emission spectrum, and the cavity absorption factor is dependent upon the extinction coefficient and thickness of the absorbing CTL layer or layers within the microcavity structure.

More particularly, as used herein, a cavity absorption factor of a given CTL layer is defined as the extinction coefficient κ multiplied by the thickness d of the CTL layer, or κd. More generally, for a light-emitting device including a microcavity structure that includes numerous CTLs, the cavity absorption factor is $\Sigma_i \kappa_i d_i$, where $\kappa_i$ is the extinction coefficient of the $i^{th}$ layer and $d_i$ is the thickness of the $i^{th}$ layer. Additionally, in accordance with embodiments of the present invention the cavity absorption factor increases as wavelength decreases for a wavelength of light within the emission spectrum of the device at normal incidence, i.e. $d(\Sigma_i \kappa_i d_i)/d\lambda < 0$. For example, the cavity absorption factor may increase linearly as wavelength decreases within the range of the device emission spectrum at normal incidence, or may increase non-linearly as wavelength decreases within the range of the device emission spectrum at normal incidence. Non-linear embodiments include configurations in which there is a local region of decrease in extinction coefficient within the overall increasing trend (e.g. shape as in FIG. 12 below).

The result of configuring a light-emitting device with a microcavity structure having a cavity absorption factor as defined is to attenuate the shorter wavelengths of light emitted from the device, and to act against the wavelength dependence of the cavity outcoupling function on viewing angle. This reduces the colour shift Δu'v' as a function of viewing angle for the device, and does so without substantially compromising other aspects of device performance, and/or without adding substantial complexity to the device configuration and manufacturing requirements.

A microcavity structure with the above-described properties of extinction coefficient may be created by using one or more absorbing charge transport layers, i.e. absorbing CTLs which have a non-zero extinction coefficient. In an exemplary embodiment, an absorbing CTL may be a compositionally homogeneous layer, in which the charge transport material is also an absorbing material with a non-zero extinction coefficient. When the absorbing charge transport layer is a homogeneous layer, the layer may comprise nanoparticles of the light absorbing material. The light absorbing material, for example, may be an inorganic metal oxide. The light absorbing material, in a more specific example, may comprise nanoparticles of an inorganic metal oxide. A homogeneous absorbing CTL may be disposed by vacuum deposition techniques, such as by thermal evaporation or sputtering, or by solution-processing techniques such as spin coating or inkjet printing.

In other exemplary embodiments, an absorbing CTL layer may be a heterogeneous material in which a component portion of the CTL layer results in absorbing properties. FIG. 2 is a drawing depicting an exemplary CTL layer 107 in accordance with embodiments of the present invention, in which the CTL layer is a heterogeneous material. In this example, an absorbing CTL 107 includes a light absorbing material 109 that is added into a non-absorbing conductive material matrix 108. The light absorbing material 109 may be an absorbing optical dopant, i.e., a material with non-zero extinction coefficient κ, which is added to a non-absorbing charge transport material that forms the conductive matrix 108. For example, the light absorbing material 109 may be configured as absorbing nanoparticles that are included within an organic charge transport matrix 108.

FIG. 3 is a drawing depicting another exemplary CTL 107 layer in accordance with embodiments of the present invention, in which the CTL layer is also a heterogeneous material. In this example, absorbing nanoparticles 109 may be mixed with conductive nanoparticles 110 to form the CTL 107. The absorbing nanoparticles 109 may be conductive or non-conductive. A heterogeneous absorbing CTL, such as depicted in FIGS. 2 and 3, may be disposed by vacuum deposition techniques such as co-evaporation, or by solution-processing from a liquid or solution containing a mixture of charge transport and absorbing materials. In the examples of FIGS. 2 and 3, the optical dopant or absorbing nanoparticles 109 may have complex refractive indices (vs wavelength) identical to or very similar to the complex refractive indices of a bulk material of the same composition. Alternatively, the optical dopant or absorbing nanoparticles 109 may be quantum dots (QDs) in which the complex refractive indices are significantly different to the complex refractive indices of a bulk material of the same composition, owing to their size, and advantageously have an extinction coefficient κ that rapidly increases as wavelength decreases, enabling a device that has a higher luminance for a given reduction in angular colour shift. The absorbing CTL, whether homogeneous or heterogeneous, may be 20 nm to 300 nm thick.

One or more absorbing CTLs may be located within a light-emitting device in a variety of configurations, which in combination with the emissive layer form a microcavity structure. Generally, one or more absorbing CTLs may be disposed only between a first electrode closest to the substrate and the EML, only between the opposing second electrode and the EML, or between both electrodes and the EML. In the following examples, in the figures like structures are identified with common reference numerals as in the conventional configuration of FIG. 1. The electrodes may be reflective or partially reflective, but at least one of the electrodes must be at least partially transmissive to emit light from the device. The light-emitting device may have a partially reflective electrode closest to the substrate and a highly reflective second electrode such that light is primarily extracted through the substrate (a bottom-emitting device), a highly reflective electrode closest to the substrate and a partially reflective second electrode such that light is primarily extracted through the second electrode (a top-emitting device), or two partially reflective electrodes such that light is significantly extracted both through the substrate and through the second electrode.

Figure 4:
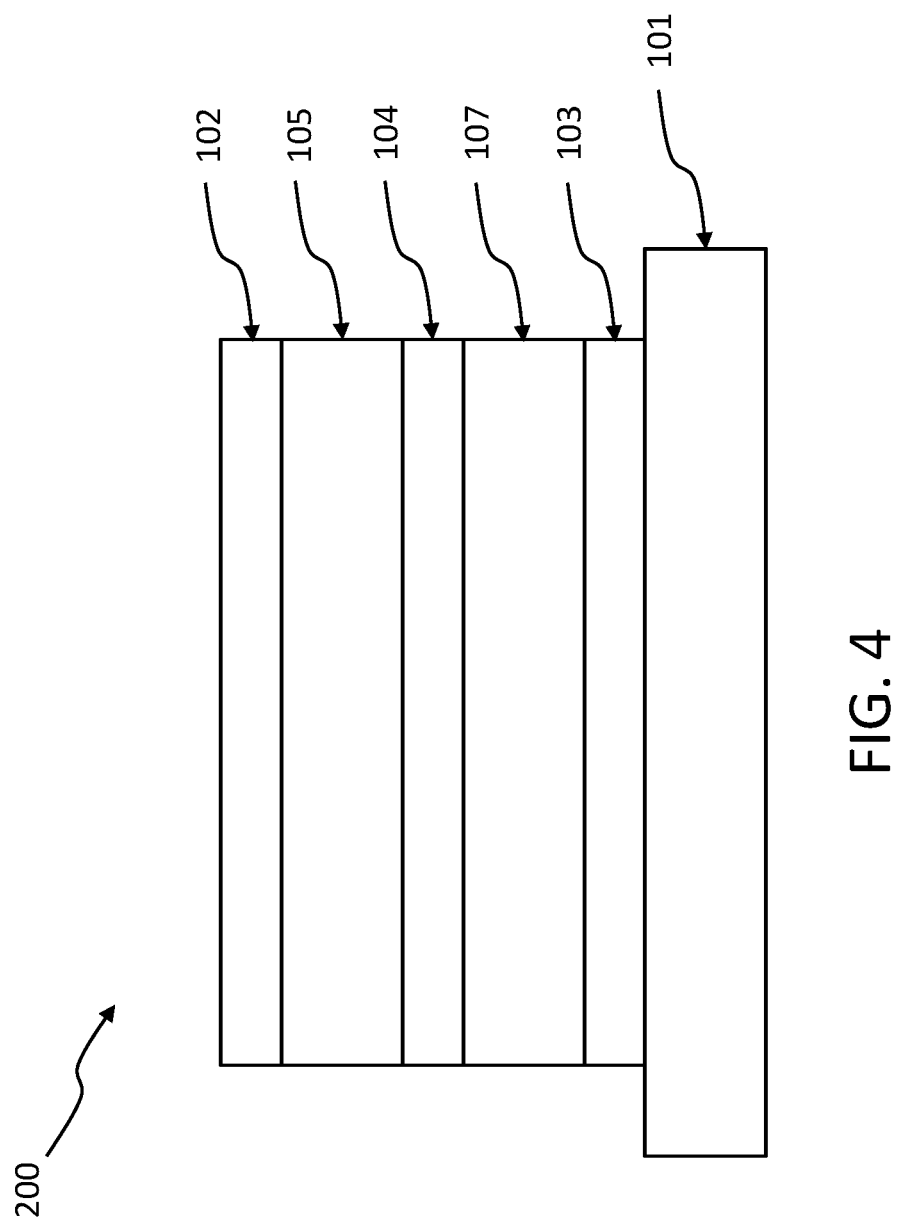
FIG. 4 is a drawing depicting an exemplary light-emitting device in accordance with embodiments of the present invention, in which an absorbing CTL is located between the EML and a first electrode located closest to the substrate.

FIG. 4 is a drawing depicting an exemplary light-emitting device 200 in accordance with embodiments of the present invention, in which an absorbing CTL 107 is located between the EML 104 and a first electrode 103 located closest to the substrate 101. The CTL 107 may be configured as described with respect to any of the embodiments, and in particular may be a homogeneous CTL or a heterogeneous CTL. Similarly as in the conventional configuration, a non-absorbing CTL 105 is disposed between the EML 104 and a second electrode 102 located on an opposite side of the EML 104 relative to the substrate 101. As referenced above, it is common for the first electrode 103 located closest to the substrate to be the anode, and the second opposing electrode 102 to be the cathode, which is denoted as the standard structure. In such configuration, the absorbing CTL 107 in FIG. 4 is a hole transporting layer (HTL) and the non-absorbing CTL 105 is an electron transporting layer (ETL). In the alternative structure denoted as the inverted structure, the first electrode 103 located closest to the substrate is the cathode, and the second opposing electrode 102 is the anode. In such configuration, the absorbing CTL 107 in FIG. 4 is an ETL and the non-absorbing CTL 105 is an HTL.

Figure 5:
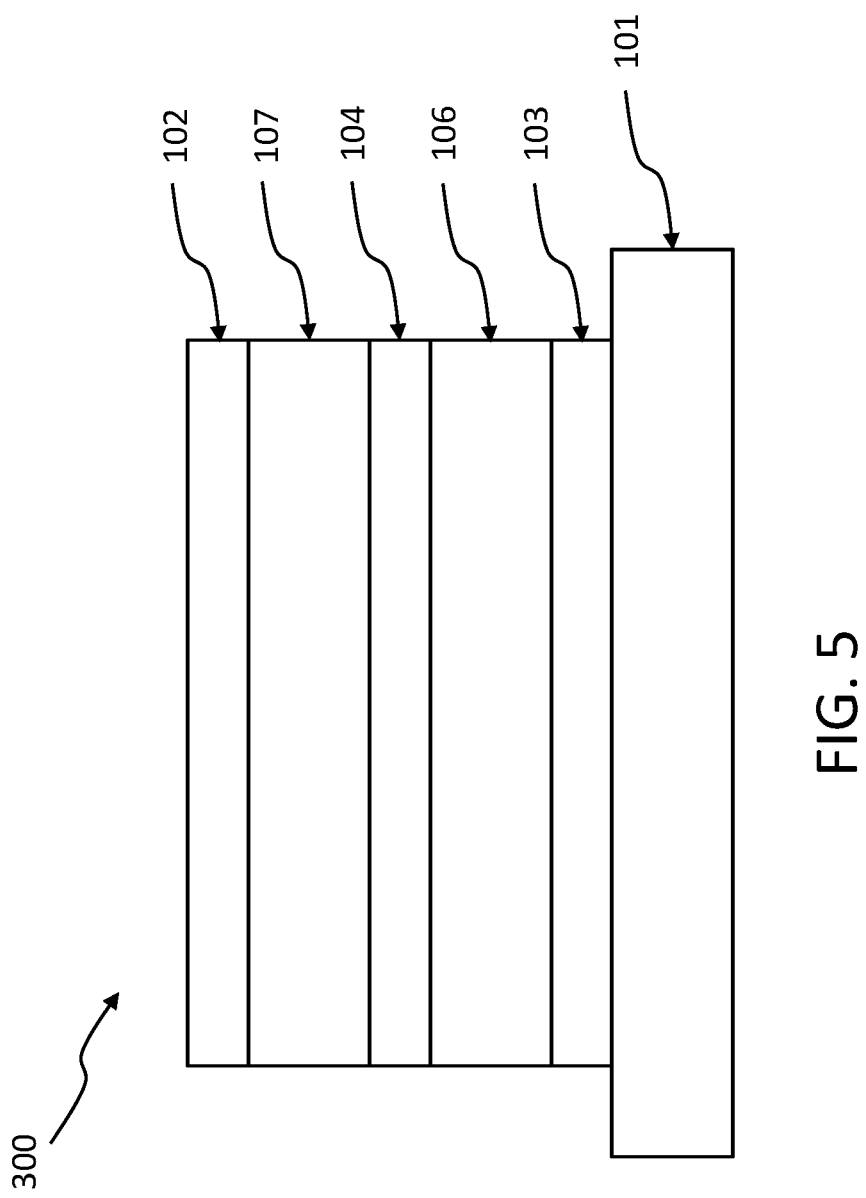
FIG. 5 is a drawing depicting another exemplary light-emitting device in accordance with embodiments of the present invention, in which an absorbing CTL is located between the EML and a second electrode located on an opposite side of the EML relative to the substrate.

FIG. 5 is a drawing depicting an exemplary light-emitting device 300 in accordance with embodiments of the present invention, in which an absorbing CTL 107 is located between the EML 104 and the second electrode 102 located on an opposite side of the EML 104 relative to the substrate 101. Again, the CTL 107 may be configured as described with respect to any of the embodiments, and in particular may be a homogeneous CTL or a heterogeneous CTL. Similarly as in the conventional configuration, a non-absorbing CTL 106 is disposed between the EML 104 and the first electrode 103 located closest to the substrate 101. For the standard structure in which the first electrode 103 is the anode and the second opposing electrode 102 is the cathode, the absorbing CTL 107 in FIG. 5 is an ETL and the non-absorbing CTL 106 is an HTL. In the alternative inverted structure in which the first electrode 103 is the cathode and the second opposing electrode 102 is the anode, the CTL 107 in FIG. 5 is an HTL and the non-absorbing CTL 106 is an ETL.

Figure 6:
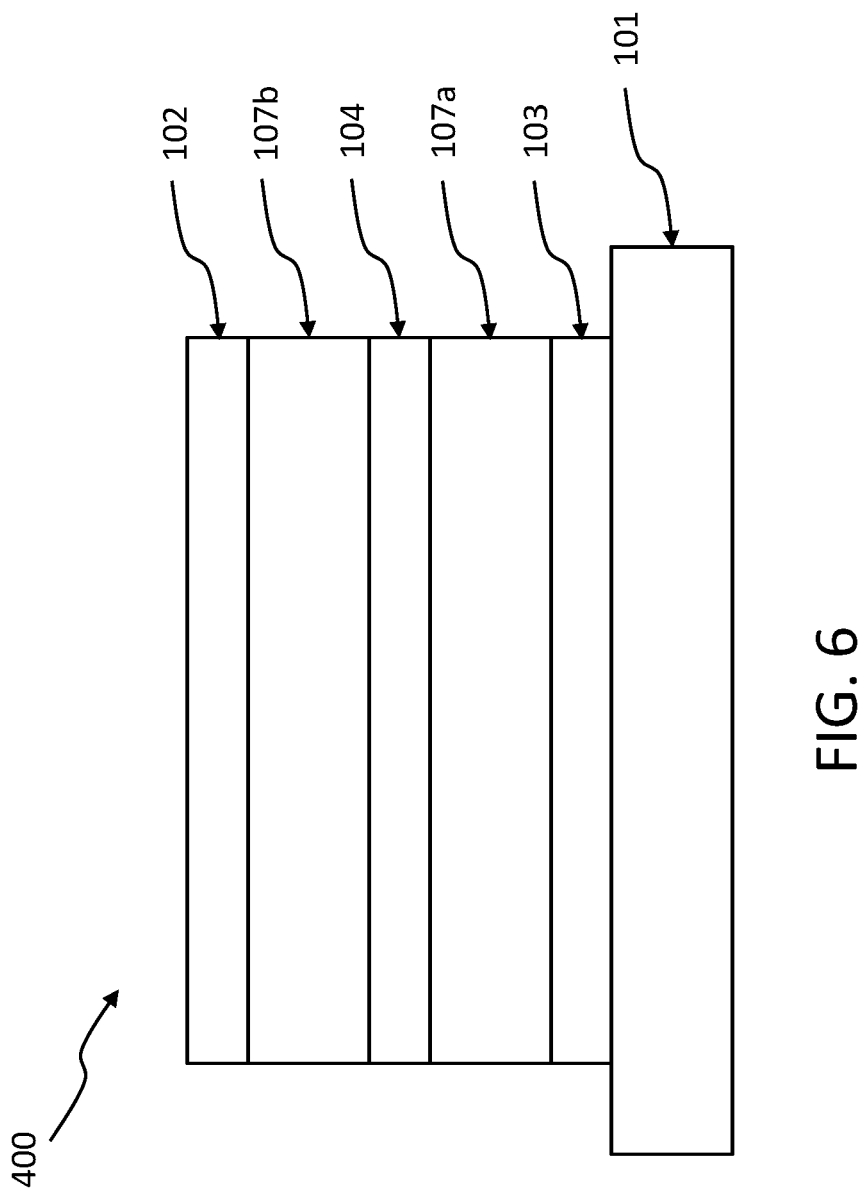
FIG. 6 is a drawing depicting another exemplary light-emitting device in accordance with embodiments of the present invention, in which an absorbing CTL is located between the EML and the first electrode, and an absorbing CTL is located between the EML and the second electrode.

FIG. 6 is a drawing depicting another exemplary light-emitting device 400 in accordance with embodiments of the present invention, in which a first absorbing CTL 107a is located between the EML 104 and the first electrode 103, and a second absorbing CTL 107b is located between the EML 104 and the second electrode 102. Again, the CTLs 107a and 107b may be configured as described with respect to any of the embodiments, and in particular may be a homogeneous CTL or a heterogeneous CTL. For the standard structure in which the first electrode 103 is the anode and the second opposing electrode 102 is the cathode, the first absorbing CTL 107a in FIG. 6 is an HTL and the second absorbing CTL 107b is an ETL. In the alternative inverted structure in which the first electrode 103 is the cathode and the second opposing electrode 102 is the anode, the first absorbing CTL 107a in FIG. 6 is an ETL and the second absorbing CTL 107b is an HTL. In addition, different materials and nanoparticle populations may be more suitable for electron transport as compared to hole transport, and vice versa. Accordingly, in exemplary embodiments in which absorbing CTLs 107a and 107b are employed between both electrodes and the EML, the first CTL 107a is materially different from the second CTL 107b.

Generalizing such structures, therefore, an aspect of the invention is a light-emitting device that includes an absorbing charge transport layer to mitigate against the undesirable colour shift. In exemplary embodiments, the light-emitting device includes an emissive layer that emits light by recombination of first charges and second charges; a first electrode from which the first charges are supplied; a second electrode located on an opposite side of the emissive layer relative to the first electrode from which the second charges are supplied; a first charge transport layer located between the emissive layer and the first electrode that injects the first charges from the first electrode into the emissive layer; and a second charge transport layer located between the emissive layer and the second electrode that injects the second charges from the second electrode into the emissive layer. At least one of the charge transport layers is an absorbing charge transport layer that includes a light absorbing material that absorbs light within a portion of the emission spectrum of the light emitted by the emissive layer.

The absorbing charge transport layer may be an ETL or an HTL, and may be located only between the first electrode adjacent to the substrate and the emissive layer, only between the opposing second electrode and the emissive layer, or between both electrodes and the emissive layer. The absorbing charge transport layer may be a homogeneous layer of the light absorbing material, a heterogeneous layer comprising one or more light absorbing materials doped within a conductive material, or a heterogeneous layer comprising a mixture of light absorbing nanoparticles and conductive nanoparticles. When the absorbing charge transport layer is a homogeneous layer, the layer may comprise nanoparticles of the light absorbing material. When the absorbing charge transport layer is a heterogeneous layer, the one or more light absorbing materials may include absorbing atoms, ions, molecules and/or nanoparticles. The absorbing atoms, ions or molecules may be or include rare earth elements. The absorbing nanoparticles may comprise one or more inorganic metal oxides, rare earth oxides, or quantum dots. The conductive material may be an organic matrix or comprise conductive nanoparticles. The conductive material may be non-absorbing which, for the purposes of this disclosure, refers to materials that do not exhibit significant absorption of the light emitted from the EML, and may be characterized by an extinction coefficient less than approximately $1 \times 10^{-3}$, and preferably less than approximately $5 \times 10^{-4}$.

The light-emitting device described herein, which may be OLED or QD-LED based devices, utilise the microcavity structures described above to enhance light output coupling while suppressing colour shift at high viewing angle. As referenced above, a microcavity structure includes the layers located between the electrodes, including the CTLs and the emissive layer. The colour shift is suppressed generally without requiring additional layers common in conventional configurations, including external colour filters, and without increasing manufacturing complexity. As also referenced above, the cavity absorption factor is $\Sigma_i \kappa_i d_i$, where $\kappa_i$ is the extinction coefficient of the $i^{th}$ layer and $d_i$ is the thickness of the $i^{th}$ layer. Additionally, in accordance with embodiments of the present invention the cavity absorption factor increases as wavelength decreases for a wavelength of light within the emission spectrum of the device at normal incidence, i.e. $d(\Sigma_i \kappa_i d_i)/d\lambda < 0$ for at least a portion of the emission spectrum including a peak wavelength, $\lambda_{peak}$. In exemplary embodiments, $d(\Sigma_i \kappa_i d_i)/d\lambda < 0$ for more than 50% of wavelengths between $\lambda_{peak}$ to $\lambda_{peak} - 2 \times$HWHM (half width at half maximum). The cavity absorption factor may satisfy $\Sigma_i \kappa_i d_i > 1 \times 10^{-1}$ nm for a wavelength of the emitted light in a range $\lambda_{peak}$ to $\lambda_{peak} - 2 \times$HWHM. The cavity absorption factor may satisfy $\Sigma_i \kappa_i d_i$ for a wavelength in the range $\lambda_{peak}$ to $\lambda_{peak} - 2 \times$HWHM is greater than a value of $\Sigma_i \kappa_i d_i$ for a wavelength in the range $\lambda_{peak}$ to $\lambda_{peak} + 2 \times$HWHM.

Figure 7:
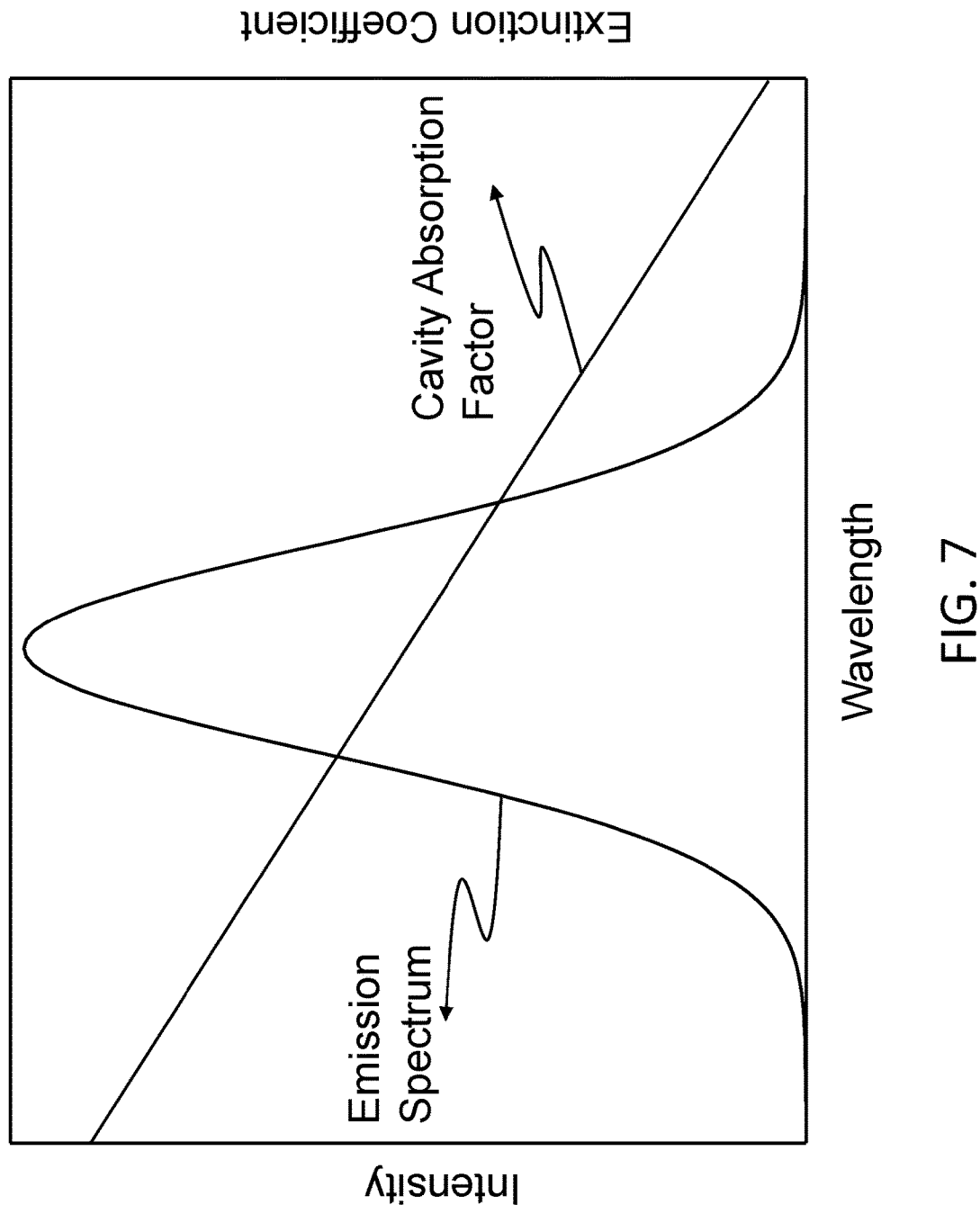
FIG. 7 is a graph showing effects of a cavity absorption factor that varies linearly with wavelength.

The use of an absorbing microcavity structure attenuates the shorter wavelengths of light emitted from the device and acts against the wavelength dependence of the cavity out-coupling function on viewing angle, reducing the colour shift $\Delta u'v'$ as a function of viewing angle for the device. In exemplary embodiments, the cavity absorption factor may increase linearly as wavelength decreases within the range of the device emission spectrum at normal incidence. FIG. 7 is a graph showing effects of a cavity absorption factor that varies linearly with wavelength. At the peak intensity of light of the emission spectrum, the absorption is insufficient to significantly affect light output. In addition, as wavelength decreases, absorption increases for such shorter wavelengths, thereby attenuating the colour shift toward the shorter wavelengths. A linear relationship as shown in FIG. 7 may be obtained by configuring an absorbing CTL as a homogeneous absorbing layer or as a heterogeneous absorbing layer having absorbing nanoparticles, for example absorbing nanoparticles with complex refractive indices identical to or very similar to the complex refractive indices of a bulk material of the same composition.

Figure 8:
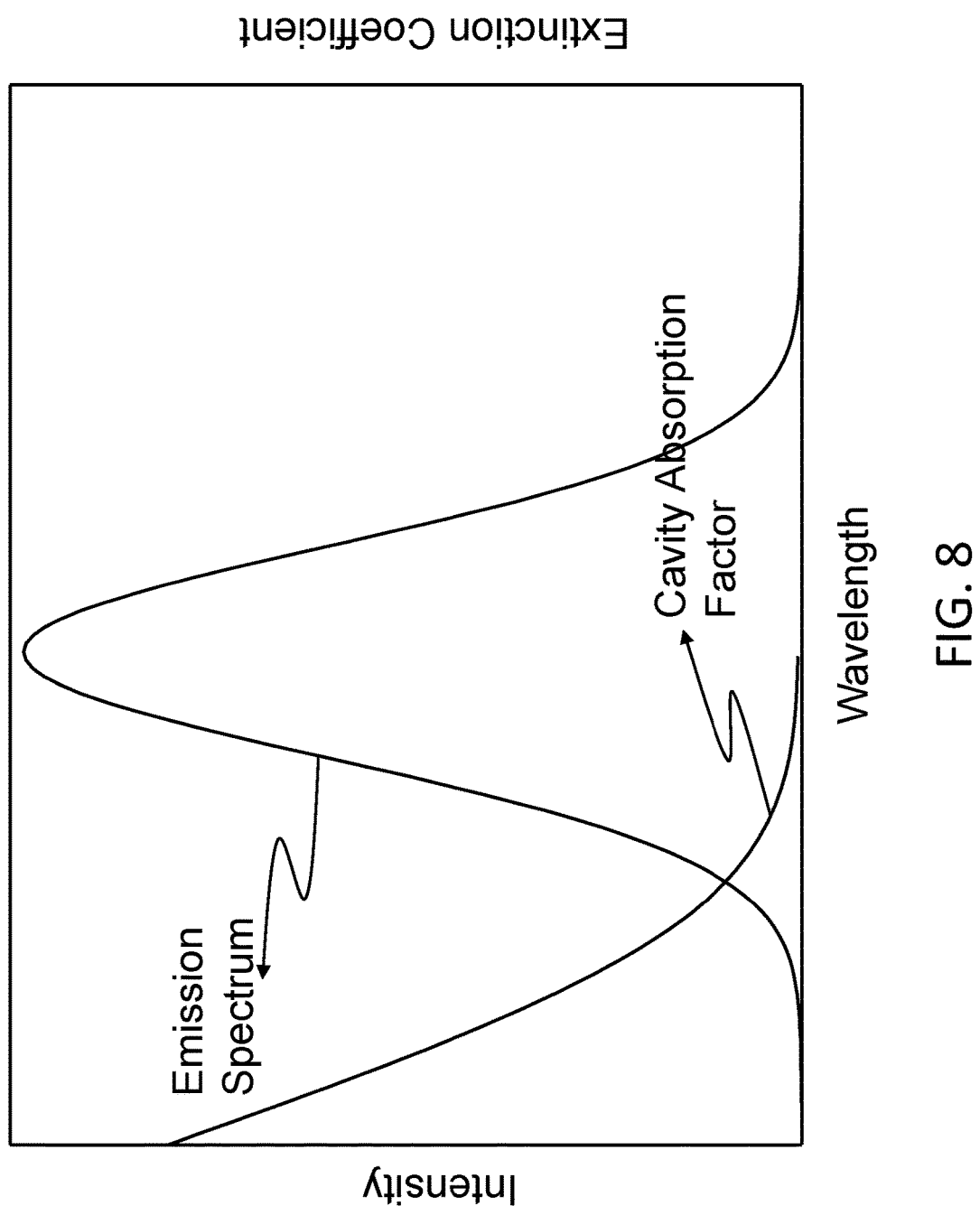
FIG. 8 is a graph showing effects of a cavity absorption factor that varies non-linearly with wavelength.

In exemplary embodiments, the cavity absorption factor may increase non-linearly as wavelength decreases within the range of the device emission spectrum at normal incidence. FIG. 8 is a graph showing effects of a cavity absorption factor that varies non-linearly with wavelength. Such operation is more preferred as the cavity absorption factor is significantly smaller for wavelengths longer than or equal to the peak wavelength of the emission spectrum of the device at normal incidence, and then increases sharply as the wavelength decreases from near peak wavelength as shown in FIG. 8. This maintains the desirable property of attenuating the shorter wavelengths which are amplified by the microcavity structure for viewing angles away from normal incidence, thereby decreasing $\Delta u'v'$ for these viewing angles. Additionally, wavelengths of light which are near peak or longer than the peak value of the emission spectrum from the device at normal incidence, and which do not significantly contribute to the angular colour shift, are not substantially attenuated. This advantageously minimises the decrease in the output luminance of the device caused by using an absorbing microcavity structure while effectively suppressing the colour shift. A non-linear relationship as shown in FIG. 8 may be obtained by configuring an absorbing CTL as a heterogeneous absorbing layer having quantum dot (QD) nanoparticles used as the absorbing dopant material.

Figure 9:
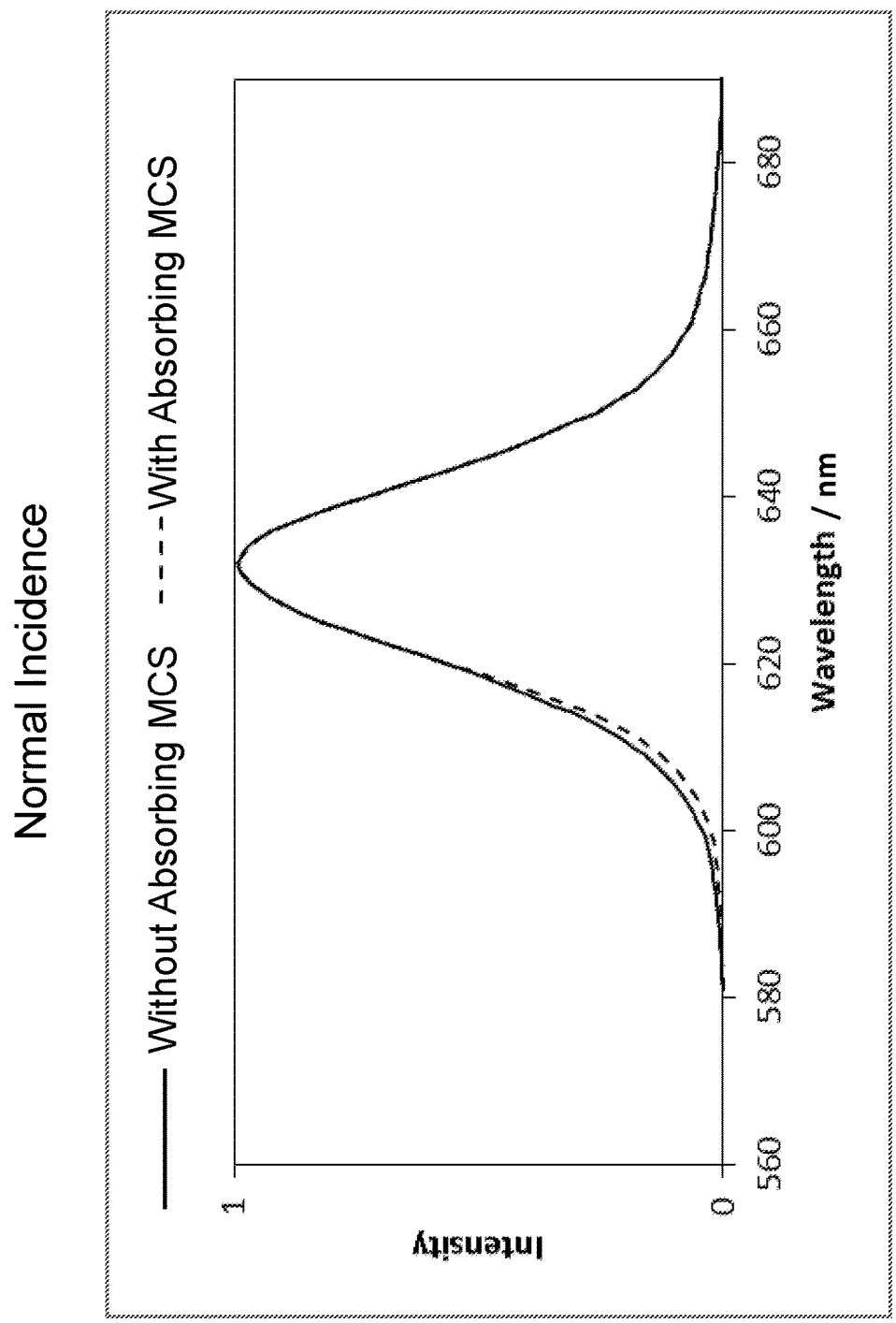
FIG. 9 is a graph of an example spectrum at normal incidence emitted from a device utilising an absorbing microcavity structure as described herein as compared to conventional configurations.
Figure 10:
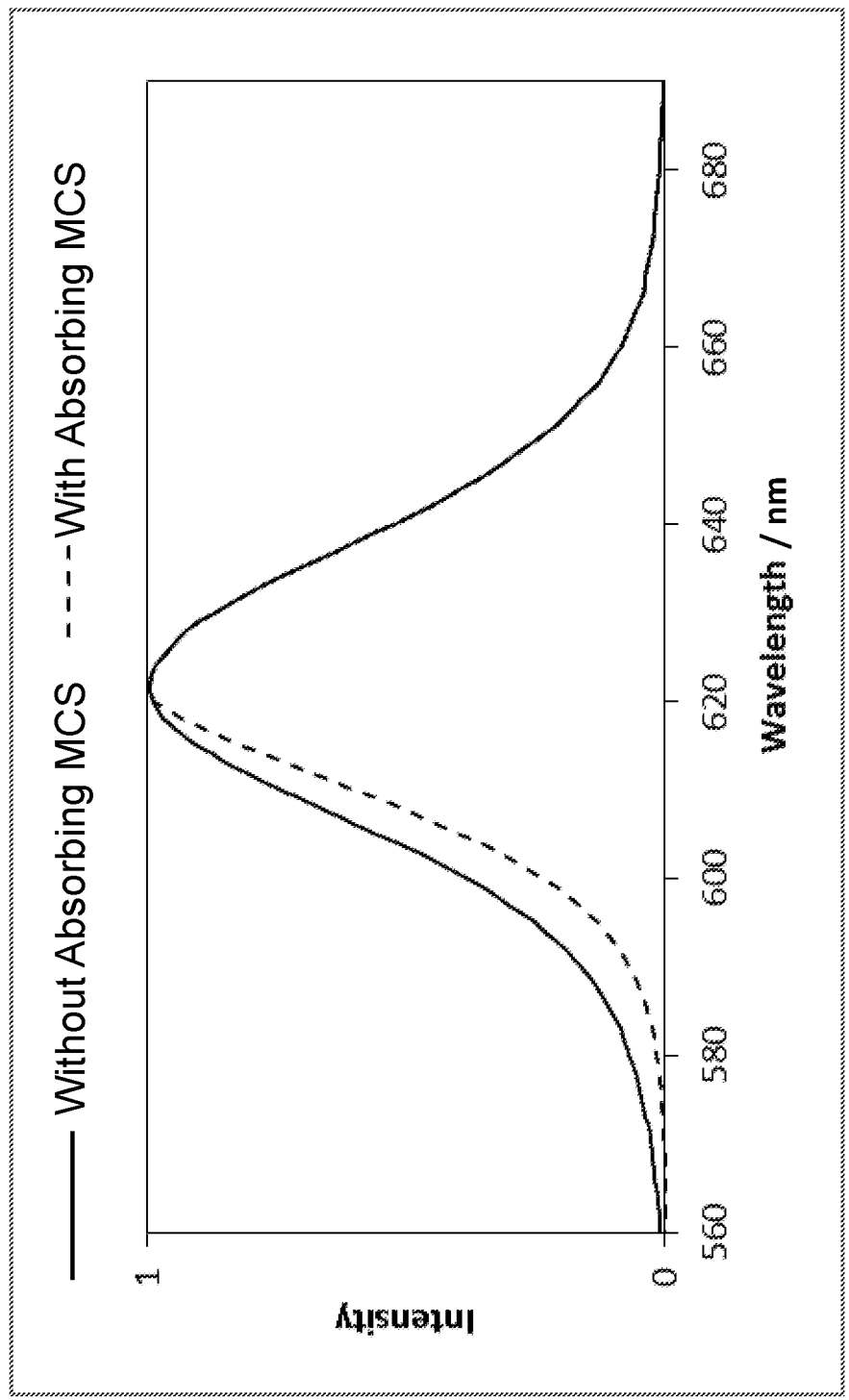
FIG. 10 is a graph of an example spectrum at high viewing angle emitted from a device utilising an absorbing microcavity structure as described herein as compared to conventional configurations.

To illustrate the benefits of the described embodiments, FIG. 9 is a graph of an example spectrum at normal incidence, and for comparison, FIG. 10 is a graph of an example spectrum at high viewing angle, emitted from a device utilising an absorbing microcavity structure (MCS) with the properties described herein, as compared to conventional configurations that do not use an absorbing microcavity structure (MCS). With reference to FIG. 9, the device emission spectrum at normal incidence (i.e., on axis viewing angle) is not substantially altered by the absorbing microcavity structure, and hence the optical power is not substantially decreased as compared to conventional configurations. In other words, at normal incidence the spectra are similar whether or not an absorbing microcavity is utilized. The minor reduction of intensity at shorter wavelengths utilizing an absorbing microcavity structure also advantageously improves the colour purity of the emission for normal incidence viewing. In a display application this enables a wider colour gamut.

In addition, with reference to FIG. 10, in conventional configurations at high viewing angle the fraction of optical power at shorter wavelengths is significantly higher as compared to when an absorbing microcavity structure is used, causing the conventional configuration to experience a colour shift to the emission from the device at normal incidence. In contrast, by employing an absorbing microcavity structure, the increase in fraction of optical power at shorter wavelengths is reduced, and the device emission spectrum is narrowed. The colour shift is advantageously decreased. While FIG. 9 and FIG. 10 correspond to light emitted in the red wavelength range (600 nm≤λ<700 nm), a comparable effect is observed for light emitted in the green (500 nm≤λ<600 nm) or blue (400 nm≤λ<500 nm) wavelength ranges.

Figure 11:
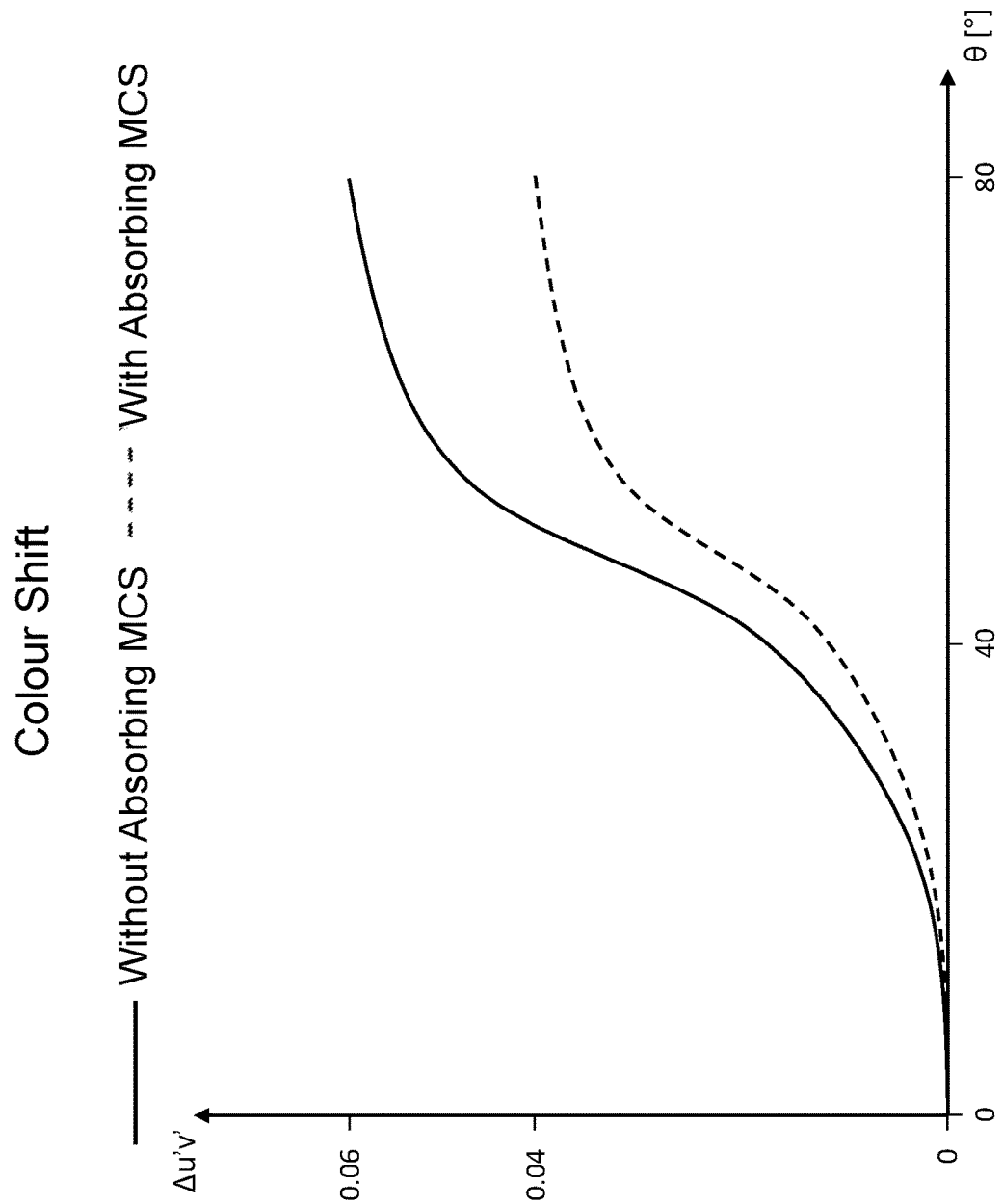
FIG. 11 is a graph depicting colour shift, $\Delta u'v'$, as function of viewing angle, $\theta$, for a conventional device and for a device employing an absorbing microcavity structure in accordance with the present invention.

As further illustration of the decrease in colour shift $\Delta u'v'$ with the present invention, FIG. 11 is a graph depicting the colour shift $\Delta u'v'$ as function of viewing angle, θ, for a conventional device and for a device employing an absorbing microcavity structure in accordance with embodiments of the present invention. As shown in FIG. 11, the colour shift is substantially reduced at higher viewing angles when an absorbing microcavity structure is employed. In exemplary embodiments, the colour shift $\Delta u'v'<0.04$. Embodiments of the present invention, therefore, yield unexpected and enhanced results over conventional configurations, in that the colour shift with increasing viewing angle from a light-emitting device is decreased without increasing the complexity of the device structure and related manufacturing process, and particularly without increasing the number of layers in the light-emitting device structure, while maintaining a high luminance output.

The principles of the present disclosure are particularly advantageous for QD-LEDs. The free-space emission spectrum from the QDs is typically narrow (preferably less than 35 nm), with a full width at half maximum (FWHM) typically <25 nm for zinc selenide QDs, <40 nm for cadmium-containing QDs (e.g. cadmium selenide), and <50 nm for indium phosphide QDs and indium phosphide based QDs which consist primarily of indium and phosphorous. This free-space emission spectrum width can be substantially narrower than from organic emitters used in the EML of OLEDs. A narrow free-space emission spectrum benefits more from a cavity with a narrow outcoupling function, further increasing outcoupling intensity and preserving the inherently high colour purity of the QD emission. However, a cavity with a narrower cavity outcoupling function will exhibit a higher $\Delta u'v'$ value at a given viewing angle than a cavity with a broader cavity outcoupling function. Therefore, by using an absorbing microcavity structure in accordance with this disclosure, an advantageously low $\Delta u'v'$ may be obtained even when the materials in the EML have narrow free-space emission and a cavity with a narrow outcoupling function is used, such as in a QD-LED.

The following provides specific examples of device configurations and operation in accordance with the principles described above. It will be appreciated that the examples are non-limiting.

An exemplary first embodiment of a light-emitting device includes a highly reflective anode with reflectivity >80% disposed on a substrate; a partially reflective semi-transparent cathode with reflectivity between 10% and 80% and transmission between 10% and 80%; an emissive layer between the anode and cathode containing emissive nanoparticles which are <30 nm in diameter, hereafter referred to as quantum dots; a hole transport layer between the anode and the emissive layer; and an electron transporting layer between the cathode and the emissive layer. The anode is closer to the substrate than the cathode, forming a top-emitting standard structure. The quantum dots have a peak free space emission wavelength, $\lambda_{FS}$, within the visible wavelength range 400 nm≤$\lambda_{FS}$≤700 nm. Preferably, the quantum dots have a core which includes a semiconductor material, and the shell surrounding the core which has a different bandgap relative to the core material. Preferably the diameter of the core is less than 10 nm.

The thicknesses of the emissive layer, hole transport layer and electron transport layer form an optical microcavity structure between the anode and cathode that preferably has a local maximum in cavity outcoupling function at a wavelength of $\lambda_{FS}$ for normal incidence emission. This produces a device with peak emission at normal incidence of $\lambda_{peak}=\lambda_{FS}$ and an emission spectrum at normal incidence with full width at half maximum (FWHM) of <80 nm. The electron transport layer has an extinction coefficient κ>1×

$10^{-3}$ at a wavelength in the range $\lambda_{peak}\pm2\times$HWHM (half width at half maximum of emission spectrum), and $d\kappa/d\lambda<0$ evaluated at $\lambda_{peak}$. For a 100 nm thick ETL, this gives a cavity absorption factor $\Sigma_i\kappa_id_i>1\times10^{-1}$ nm at a wavelength in the range $\lambda_{peak}\pm2\times$HWHM, and $d(\Sigma_i\kappa_id_i)/d\lambda<0$ evaluated at $\lambda_{peak}$ advantageously producing a device with a colour shift $\Delta u'v'<0.04$ over the viewing angle range $0°\leq\theta\leq80°$. Preferably, the ETL has $\kappa>1\times10^{-2}$ so that $\Sigma_i\kappa_id_i>1\times10^{10}$ nm, and more preferably the ETL has $\kappa>1\times10^{-1}$ so that $\Sigma_i\kappa_id_i>1\times10^1$ nm. A cavity absorption factor of $3.3\times10^1$ nm will remove approximately 50% of 600 nm wavelength light in a single pass through 60 nm of equivalent material. In exemplary embodiments, the electron transport layer has an extinction coefficient $\kappa>5\times10^{-4}$ at a wavelength in the range $\lambda_{peak}\pm2\times$HWHM. A thinner layer with a higher $\kappa$ or a thicker layer with a lower may be used to achieve the same cavity absorption factor, thereby achieving a light-emitting device with a similarly low colour shift over the same range of viewing angles. Therefore, a target cavity absorption factor may be obtained for an electron transport layer with thickness which provides an optical microcavity with a suitable local maximum in cavity outcoupling function and/or good electrical properties, such as conductivity.

As a variation in the above, a light-emitting device has an absorbing ETL that has an extinction coefficient $\kappa>1\times10^{-3}$ at a wavelength in the range between $\lambda_{peak}$ and ($\lambda_{peak}-2\times$HWHM) and $\kappa<1\times10^{-3}$ between $\lambda_{peak}$ and ($\lambda_{peak}+2\times$HWHM). This advantageously produces a device with reduced colour shift at high viewing angle while maintaining a higher overall device luminance as compared to the first embodiment.

As another variation in the above, a light-emitting device has an absorbing ETL that has an extinction coefficient $\kappa>1\times10^{-3}$ at a wavelength in the range $\lambda_{peak}\pm2\times$HWHM, $d\kappa/d\lambda<0$ evaluated at $\lambda_{peak}$ and $\kappa<1\times10^{-3}$ for wavelengths between the wavelength with highest intensity (I) in the cavity outcoupling function (equation 1) evaluated at $\theta=45°$ and ($\lambda_{peak}+2\times$HWHM). This advantageously produces a device with reduced colour shift at high viewing angle while maintaining a higher overall device luminance than the previous variation.

As another variation, a light-emitting device has an absorbing ETL that is a heterogeneous layer including a charge transporting material and an absorbing optical dopant which contributes the majority of the extinction coefficient of the ETL layer in the wavelength range where $\kappa>1\times10^{-3}$. This advantageously increases the range of charge transport materials which can be used in the device, improving the electrical characteristics of the device while maintaining the reduced colour shift at high viewing angle. For example, the absorbing optical dopant may be nanocrystals or nanoparticles with diameter less than 30 nm, and the features detailed below for quantum dots (QDs) also may apply to this embodiment.

As another exemplary embodiment, the heterogeneous layer is a mixture of nanoparticles. The charge transporting material is a first type of nanoparticle, such as metal oxide nanoparticles, and the absorbing optical dopant is a second type of nanoparticle such as nanocrystal quantum dots. As referenced above, quantum dots advantageously have an extinction coefficient $\kappa$ that rapidly increases as wavelength decreases, enabling a device that has higher luminance for a given reduction in angular colour shift. Additionally, the absorption properties of the quantum dots may be easily tuned during QD manufacture. For example, the size or composition of the QDs may be configured to provide a variation in extinction coefficient with wavelength as required for embodiments of the present invention. This enables QDs to be used to create a desirable cavity absorption factor for wavelengths throughout the visible spectral range. QDs are also advantageously easily combined in solution with metal oxide charge transporting nanoparticles.

Figure 12:
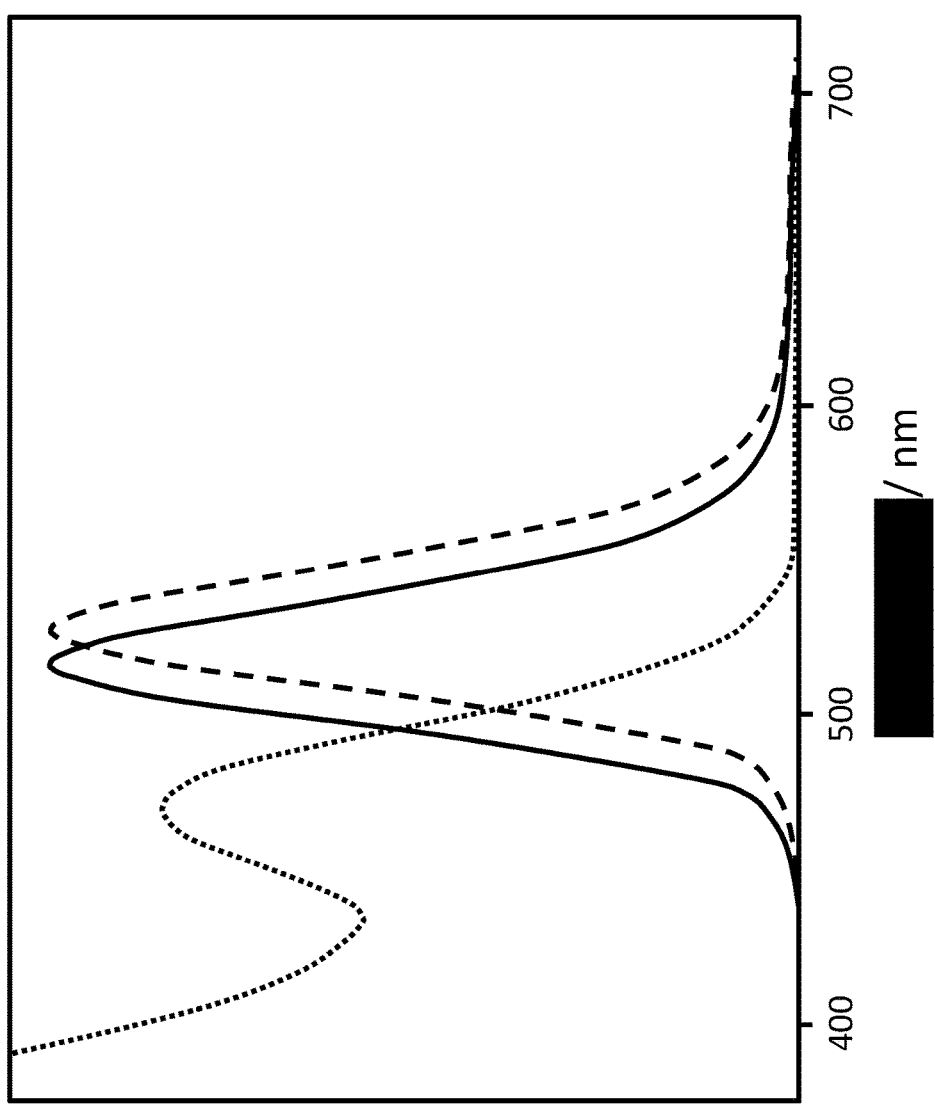
FIG. 12 is a graph depicting performance of a light-emitting device with quantum dots (QDs) in the emissive layer ("QD EL Emission"), and the extinction coefficient of said QDs.

FIG. 12 is a graph depicting performance of a light-emitting device with QDs in the EML ("QD EL Emission"), and extinction coefficient of said QDs. Preferably, the QDs that are an optical dopant incorporated into the CTL are configured so that, once in the layer together with the charge transporting material, the QDs do not emit visible light. In an example, the QDs that are used as the absorbing optical dopant are the same type of material as QDs in the EML, but configured such that the absorbing optical dopant QDs do not emit visible light when in the device. For example, the QDs are configured with organic ligands such that their optical emission is negligible, are configured without organic ligands, or are configured without a shelling layer. In an example, the QDs that are used as the absorbing optical dopant are the same type of material as QDs in the EML, but are on average larger than the QDs in the EML.

The absorption edge of QDs occurs for longer wavelengths in larger QDs. This increases the extinction coefficient $\kappa$ of the QDs for a given wavelength, advantageously enabling a lower amount of the optical dopant material which must be included in the CTL to achieve the same absorption. In another example, the QDs that are used as the absorbing optical dopant are the same type of material as QDs in the EML, but are on average smaller than the QDs in the EML. This decreases the extinction coefficient $\kappa$ of the QDs at the peak wavelength of the emission at normal incidence from the device, advantageously increasing the luminance emitted from the device.

In another example, the QDs that are used as the absorbing optical dopant are of the same type as the QDs used in the EML, i.e. all QDs have the same core material and all QDs have the same shell material. The emission from the optical dopant QDs may be quenched by mixing with the CTL material. This advantageously simplifies the manufacturing process by using the same material as an optical dopant as is used in the EML. For example, there can be a variation in QD properties (e.g. size, composition) between manufacturing batches or processes, which means that the absorption required from the optical dopant can vary for different QDs in the EML. If QDs with the same properties (e.g. from the same manufacturing batch or process) are used as the optical dopant and in the EML, then there is an advantageous alignment of the properties, ensuring consistent properties between different devices.

Furthermore, with reference to FIG. 12, the QD-LED may be configured so that the electroluminescence (EL) spectrum peak is at longer wavelength compared to the photoluminescence (PL) spectrum and the edge of the extinction coefficient spectrum. Typically, for a given QD material the relationship between extinction coefficient and PL intensity with respect to wavelength is significantly less dependent on the QD-LED structure compared to the relationship between extinction coefficient and EL intensity with respect to wavelength. This advantageously moves the peak of the QD EL emission to a wavelength for which the QD material has a smaller extinction coefficient, while the shorter wavelength EL emission from the QDs is within the same wavelength range where the QD extinction coefficient is increasing rapidly. FIG. 12 is shown for QDs emitting green light, but similar results are obtained for QDs emitting other visible wavelengths.

As another variation, the hole transporting layer contributes the large extinction coefficient to the optical cavity instead of the electron transporting layer. As another variation, the light-emitting device uses a highly reflective cathode disposed on the substrate and a partially reflective semi-transparent anode. The cathode is closer to the substrate than the anode, forming a top-emitting inverted structure.

In another exemplary embodiment, an electronic device, such as a display device, employs a plurality of devices of light-emitting devices in which at least one of the light-emitting devices is configured in accordance with the principles of the present disclosure. Accordingly, another aspect of the invention is a display device having a plurality of light-emitting devices according to any of the embodiments. In such a display device, each light-emitting device has a peak emission wavelength at normal incidence in one of the red, green, or blue portion of the visible spectrum. As to each light-emitting device, the emissive layer, the first charge transport layer, and the second charge transport layer comprise a microcavity structure. Each light emitting device is configured to have a cavity absorption factor of the microcavity structure directed to attenuating light of a wavelength having a shorter wavelength than a respective peak emission wavelength for said light-emitting device.

Figure 13:
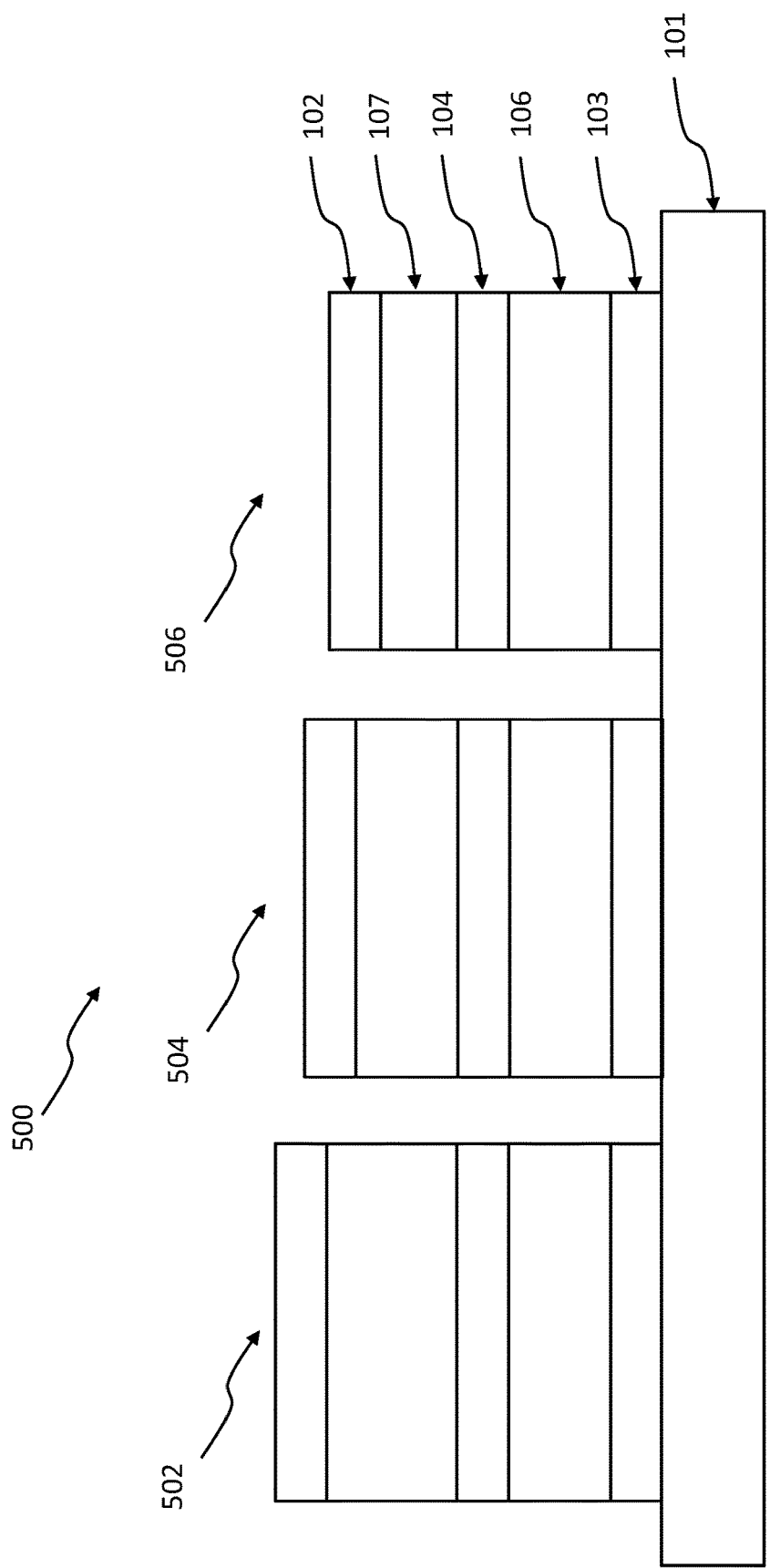
FIG. 13 is a drawing depicting an exemplary display device having a plurality of light-emitting devices in accordance with embodiments of the present invention.

FIG. 13 is a drawing depicting an exemplary display device 500 having a plurality of light-emitting devices in accordance with embodiments of the present invention. Three exemplary light-emitting devices 502, 504, and 506 are shown deposited on the substrate 101 for purposes of illustration. It will be appreciated that any number of light-emitting devices may be provided as is are suitable for any particular display application. The different thicknesses of the three devices indicate different cavity lengths for red (502), green (504), and blue (506) light-emitting devices. At least one of the light-emitting devices has an absorbing charge transport layer 107, shown in an exemplary configuration in FIG. 13. It will be appreciated that one or more absorbing charge transport layers may be provided in a light-emitting device 502, 504, and/or 506 in accordance with any of the embodiments. It will further be appreciated that any portion or subset of the light-emitting devices, up to all of them, may include an absorbing charge transport layer.

In exemplary embodiments, each light-emitting device is configured to emit light with a peak wavelength at normal incidence in either the red (600 nm $\leq \lambda_{peak} \leq 700$ nm), green (500 nm $\leq \lambda_{peak} < 600$ nm), or blue (400 nm $\leq \lambda_{peak} < 500$ nm) region of the visible spectrum and be separately addressable. The microcavity structure and cavity absorption factor are configured separately for each light-emitting device based on the colour of its emission to achieve reduced colour shift with viewing angle for all three colours of emission for the overall electronic device. One or more of the layers in an electronic device may be common to the plurality of the devices. Each light-emitting device may form a sub-pixel in a display device. In an example, the red, green and blue subpixels are configured so that the ratio of subpixel output intensity at high angle divided by subpixel output intensity at normal incidence is similar for all three colours of emission, such that Δu'v' for a white point colour between normal incidence and high angle is less than 0.04, and preferably less than 0.02.

Materials and other structural aspects of the various layers and components of a light-emitting device may be configured in accordance with the following examples. It will be appreciated that such examples are non-limiting. An example ETL may include individual or combinations of ZnO, 8-quinolinolato lithium (Liq.), LiF, $Cs_2CO_3$, $Mg_xZn_{1-x}O$, $Al_xZn_{1-x}O$, 2,2',2''-(1,3,5-benzinetriyl)-tris(1-phenyl-1-H-benzimidazole) (TPBi), $TiO_2$, $ZrO_2$, where $0 \leq x \leq 1$. An example EML may include QDs (nanoparticles) which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, perovskites of the form $ABX_3$, $Zn_wCu_zIn_{1-(w-z)}S$, carbon, where $0 \leq w$, x, y, $z \leq 1$ and (w+z) 1. An example HTL may include individual or combinations of poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N, N'-bis(4-butylphenyl)-N, N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN). Absorbing optical dopants may include QDs comparably as specified as for the EML, or rare earth oxides such as $Sm_2O_3$ or $Ho_2O_3$. A partially reflective contact electrode may include Ag thinner than 30 nm, or an Mg:Ag alloy thinner than 30 nm. A highly reflective contact electrode may include Al or Ag thicker than 30 nm, or a Ca/Al bilayer.

An example light-emitting device may include the following layer structure: 1 mm glass substrate|100 nm Al cathode|40 nm mixed ZnO and InP/ZnS QD optically absorbing ETL|25 nm InP/ZnS QD EML emitting with free space wavelength λ=630 nm|60 nm $MoO_3$ HTL|25 nm Ag anode. A InP/ZnS QD is a nanoparticle comprising a InP core with a ZnS shell. Such a device may be manufactured as follows. A layer of 100 nm of aluminium is thermally evaporated through a shadow mask onto a 1 mm thick glass substrate to define a cathode region. ZnO nanoparticles and InP/ZnS quantum dots are mixed in ethanol and deposited on top of the cathode by spin coating, and then baked at 110° C. to form an optically absorbing ETL. InP/ZnS quantum dots are deposited on top of the ETL by spin coating from octane. $MoO_3$ nanoparticles are deposited on top of the EML by spin coating from ethanol followed by baking at 70° C. to form an HTL. 25 nm of silver is thermally evaporated on top of the HTL to provide a partially reflective semi-transparent anode.

An aspect of the invention is a light-emitting device that includes an absorbing charge transport layer to mitigate against the undesirable colour shift. In exemplary embodiments, the light-emitting device includes an emissive layer that emits light by recombination of first charges and second charges; a first electrode from which the first charges are supplied; a second electrode located on an opposite side of the emissive layer relative to the first electrode from which the second charges are supplied; a first charge transport layer located between the emissive layer and the first electrode that injects the first charges from the first electrode into the emissive layer; and a second charge transport layer located between the emissive layer and the second electrode that injects the second charges from the second electrode into the emissive layer. At least one of the charge transport layers is an absorbing charge transport layer that includes a light absorbing material that absorbs light within a portion of the emission spectrum of the light emitted by the emissive layer. The light-emitting device may include one or more of the following features, either individually or in combination.

In an exemplary embodiment of the light-emitting device, the absorbing charge transport layer comprises a homogeneous layer of the light absorbing material.

In an exemplary embodiment of the light-emitting device, the light absorbing material is an inorganic metal oxide or light absorbing nanoparticles.

In an exemplary embodiment of the light-emitting device, the absorbing charge transport layer is a heterogeneous layer comprising one or more light absorbing materials doped within a conductive material.

In an exemplary embodiment of the light-emitting device, the light absorbing material is light absorbing nanoparticles and the conductive material is an organic matrix.

In an exemplary embodiment of the light-emitting device, the absorbing charge transport layer is a heterogeneous layer comprising a mixture of light absorbing nanoparticles and conductive nanoparticles.

In an exemplary embodiment of the light-emitting device, the light absorbing nanoparticles comprise quantum dots.

In an exemplary embodiment of the light-emitting device, the quantum dots of the absorbing charge transport layer are configured only to absorb light within the emission spectrum and not to emit visible light.

In an exemplary embodiment of the light-emitting device, the emissive layer is a quantum dot semiconductor emissive layer, and the quantum dots of the absorbing charge transport layer are made of a same material as the quantum dots of the emissive layer.

In an exemplary embodiment of the light-emitting device, the quantum dots of the absorbing charge transport layer and the quantum dots of the emissive layer have a same average size.

In an exemplary embodiment of the light-emitting device, the emissive layer includes an organic material.

In an exemplary embodiment of the light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein the absorbing charge transport layer is the electron transport layer.

In an exemplary embodiment of the light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein the absorbing charge transport layer is the hole transport layer.

In an exemplary embodiment of the light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein the electron transport layer and the hole transport layer both are absorbing charge transport layers.

In an exemplary embodiment of the light-emitting device, the device further includes a substrate, wherein the anode is located closest to the substrate as compared to the cathode.

In an exemplary embodiment of the light-emitting device, the device further includes a substrate, wherein the cathode is located closest to the substrate as compared to the anode.

In an exemplary embodiment of the light-emitting device, the emissive layer, one or more first charge transport layers, and one or more second charge transport layer comprise a microcavity structure; the microcavity structure has a cavity absorption factor defined as $\Sigma_i \kappa_i d_i$, where $\kappa_i$ is an extinction coefficient of the $i^{th}$ layer and $d_i$ is a thickness of the $i^{th}$ layer; and the cavity absorption factor increases as wavelength decreases for a wavelength of light within the emission spectrum of the light-emitting device at normal incidence $(d(\Sigma_i \kappa_i d_i)/d\lambda < 0)$ for at least a portion of the emission spectrum including a peak wavelength $\lambda_{peak}$ of the emission spectrum.

In an exemplary embodiment of the light-emitting device, the cavity absorption factor $\Sigma_i \kappa_i d_i > 1 \times 10^{-1}$ nm for a wavelength of the emitted light in a range $\lambda_{peak}$ to $\lambda_{peak} - 2\times$ HWHM (half width at half maximum)

In an exemplary embodiment of the light-emitting device, a value of the cavity absorption factor $\Sigma_i \kappa_i d_i$ for a wavelength in the range $\lambda_{peak}$ to $\lambda_{peak} - 2\times$HWHM is greater than a value of $\Sigma_i \kappa_i d_i$ for a wavelength in the range $\lambda_{peak}$ to $\lambda_{peak} + 2\times$HWHM.

Another aspect of the invention is an electronic device including a plurality of light-emitting devices including at least one light-emitting device according to any of the embodiments. In exemplary embodiments of the display device, the at least one light-emitting device has a peak emission wavelength at normal incidence in one of the red, green, or blue portion of the visible spectrum; as to the at least one light-emitting device, the emissive layer, the first charge transport layer, and the second charge transport layer comprise a microcavity structure; and the at least one light emitting device is configured to have a cavity absorption factor of the microcavity structure directed to attenuating light of a wavelength having a shorter wavelength than a respective peak emission wavelength for said light-emitting device.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to light-emitting devices that, for example, may be used for light-emitting elements in a display device, and OLED and QLED type display technologies are suitable examples. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high resolution display is desirable.

REFERENCE SIGNS LIST

100—light-emitting device structure
101—substrate

102—cathode
103—anode
104—emissive layer (EML)
105—first charge transport layer (CTL)
106—second charge transport layer (CTL)
107—absorbing CTL layer
107a—first absorbing CTL
107b—second absorbing CTL
108—conductive material
109—light absorbing material
110—nanoparticles
200—light-emitting device
300—light-emitting device
400—light-emitting device
500—exemplary display device
502—exemplary first light-emitting device
504—exemplary second light-emitting device
506—exemplary third light-emitting device

The invention claimed is:

1. A light-emitting device comprising:
an emissive layer that emits light by recombination of first charges and second charges;
a first electrode from which the first charges are supplied;
a second electrode located on an opposite side of the emissive layer relative to the first electrode from which the second charges are supplied;
a first charge transport layer located between the emissive layer and the first electrode that injects the first charges from the first electrode into the emissive layer; and
a second charge transport layer located between the emissive layer and the second electrode that injects the second charges from the second electrode into the emissive layer;
wherein at least one of the charge transport layers is an absorbing charge transport layer that includes a light absorbing material that absorbs light within a portion of the emission spectrum of the light emitted by the emissive layer.

2. The light-emitting device of claim 1, wherein the absorbing charge transport layer comprises a homogeneous layer of the light absorbing material.

3. The light-emitting device of claim 2, wherein the light absorbing material is one of an inorganic metal oxide or light absorbing nanoparticles.

4. The light-emitting device of 1, wherein the absorbing charge transport layer is a heterogeneous layer comprising one or more light absorbing materials doped within a conductive material.

5. The light-emitting device of 4, wherein the one or more light absorbing materials are light absorbing nanoparticles and the conductive material is an organic matrix.

6. The light-emitting device of claim 1, wherein the absorbing charge transport layer is a heterogeneous layer comprising a mixture of light absorbing nanoparticles and conductive nanoparticles.

7. The light-emitting device of claim 5, wherein the light absorbing nanoparticles comprise quantum dots.

8. The light-emitting device of claim 7, wherein the quantum dots of the absorbing charge transport layer are configured only to absorb light within the emission spectrum and not to emit visible light.

9. The light-emitting device of claim 7, wherein the emissive layer is a quantum dot semiconductor emissive layer, and the quantum dots of the absorbing charge transport layer are made of a same material as the quantum dots of the emissive layer.

10. The light-emitting device of claim 9, wherein the quantum dots of the absorbing charge transport layer and the quantum dots of the emissive layer have a same average size.

11. The light-emitting device of claim 1, wherein the emissive layer includes an organic material.

12. The light-emitting device of claim 1, wherein:
the first electrode is a cathode and the second electrode is an anode;
the first charge transport layer is an electron transport layer that injects electrons from the cathode into the emissive layer; and
the second charge transport layer is a hole transport layer that injects holes from the anode into the emissive layer;
wherein the absorbing charge transport layer is the electron transport layer.

13. The light-emitting device of claim 1, wherein:
the first electrode is a cathode and the second electrode is an anode;
the first charge transport layer is an electron transport layer that injects electrons from the cathode into the emissive layer; and
the second charge transport layer is a hole transport layer that injects holes from the anode into the emissive layer;
wherein the absorbing charge transport layer is the hole transport layer.

14. The light-emitting device of claim 1, wherein:
the first electrode is a cathode and the second electrode is an anode;
the first charge transport layer is an electron transport layer that injects electrons from the cathode into the emissive layer; and
the second charge transport layer is a hole transport layer that injects holes from the anode into the emissive layer;
wherein the electron transport layer and the hole transport layer both are absorbing charge transport layers.

15. The light-emitting device of claim 12, further comprising a substrate, wherein the anode is located closest to the substrate as compared to the cathode.

16. The light-emitting device of claim 12, further comprising a substrate, wherein the cathode is located closest to the substrate as compared to the anode.

17. The light-emitting device of claim 1, wherein:
the emissive layer, one or more first charge transport layers, and one or more second charge transport layer comprise a microcavity structure;
the microcavity structure has a cavity absorption factor defined as $\Sigma_i \kappa_i d_i$, where $\kappa_i$ is an extinction coefficient of the $i^{th}$ layer and $d_i$ is a thickness of the $i^{th}$ layer; and
the cavity absorption factor increases as wavelength decreases for a wavelength of light within the emission spectrum of the light-emitting device at normal incidence ($d(\Sigma_i \kappa_i d_i)/d\lambda < 0$) for at least a portion of the emission spectrum including a peak wavelength $\lambda_{peak}$ of the emission spectrum.

18. The light-emitting device of claim 17, wherein the cavity absorption factor $\Sigma_i \kappa_i d_i > 1 \times 10^{-1}$ nm for a wavelength of the emitted light in a range $\lambda_{peak}$ to $\lambda_{peak} - 2 \times$HWHM (half width at half maximum).

19. The light-emitting device of claim 17, wherein a value of the cavity absorption factor $\Sigma_i \kappa_i d_i$ for a wavelength in the range $\lambda_{peak}$ to $\lambda_{peak} - 2 \times$HWHM is greater than a value of $\Sigma_i \kappa_i d_i$ for a wavelength in the range $\lambda_{peak}$ to $\lambda_{peak} + 2 \times$HWHM.

20. An electronic device comprising:
a plurality of light-emitting devices including at least one light-emitting device according to claim 1; wherein:
the at least one light-emitting device has a peak emission wavelength at normal incidence in one of the red, green, or blue portion of the visible spectrum;
as to the at least one light-emitting device, the emissive layer, the first charge transport layer, and the second charge transport layer comprise a microcavity structure; and
the at least one light emitting device is configured to have a cavity absorption factor of the microcavity structure directed to attenuating light of a wavelength having a shorter wavelength than a respective peak emission wavelength for said light-emitting device.

* * * * *